US008867285B2

(12) United States Patent
You (10) Patent No.: US 8,867,285 B2
(45) Date of Patent: Oct. 21, 2014

(54) SEMICONDUCTOR APPARATUS AND DATA WRITE CIRCUIT OF SEMICONDUCTOR APPARATUS FOR PREVENTING TRANSMISSION ERROR (75) Inventor: Jung Taek You, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 488 days.

(21) Appl. No.: 13/230,115

(22) Filed: Sep. 12, 2011

(65) Prior Publication Data

US 2012/0051149 A1 Mar. 1, 2012

Related U.S. Application Data (63) Continuation-in-part of application No. 12/345,860, filed on Dec. 30, 2008, now abandoned.

(30) Foreign Application Priority Data

Nov. 13, 2008 (KR) .................. 10-2008-0112687

(51) Int. Cl.
G11C 7/00 (2006.01)
G11C 7/22 (2006.01)
G11C 7/10 (2006.01)
G11C 7/02 (2006.01)

(52) U.S. Cl.
CPC .. *G11C 7/02* (2013.01); *G11C 7/22* (2013.01); *G11C 7/222* (2013.01); *G11C 2207/107* (2013.01); *G11C 7/1093* (2013.01); *G11C 7/1096* (2013.01); *G11C 7/1078* (2013.01); *G11C 7/1087* (2013.01)
USPC ............ 365/189.16; 365/189.05; 365/233.11; 365/233.1

(58) Field of Classification Search
USPC ................ 365/189.16, 189.05, 233.11, 233.1
See application file for complete search history.

(56) References Cited

U.S. PATENT DOCUMENTS

| 6,937,524 | B2 | 8/2005 | Shiga et al. |
| 6,987,704 | B2 * | 1/2006 | Park .................... 365/185.17 |
| 7,038,953 | B2 | 5/2006 | Aoki |
| 7,136,312 | B2 | 11/2006 | Fujimoto et al. |
| 7,298,666 | B2 | 11/2007 | Lee |
| 2007/0073982 | A1 * | 3/2007 | Kim et al. .................... 711/149 |

FOREIGN PATENT DOCUMENTS

| JP | 02-143557 A | 6/1990 |
| KR | 1020020004860 A | 1/2002 |
| KR | 10-1003119 B1 | 12/2010 |

OTHER PUBLICATIONS

USPTO OA mailed Sep. 15, 2010 in connection with U.S. Appl. No. 12/345,860.
USPTO OA mailed Mar. 2, 2011 in connection with U.S. Appl. No. 12/345,860.
USPTO NOA mailed Jun. 10, 2011 in connection with U.S. Appl. No. 12/345,860.

\* cited by examiner

*Primary Examiner* — Kretelia Graham
(74) *Attorney, Agent, or Firm* — Ladas & Parry LLP (57) ABSTRACT A data write circuit of a semiconductor apparatus includes a plurality of latches configured to latch a plurality of data in response to activation of a plurality of control signals and output the latched data to data lines; and a control unit configured to generate the plurality of control signals to be activated at different timings, such that partial data input at relatively earlier timing among the plurality of data is latched at earlier timing than the other data by a portion of the plurality of latches.

12 Claims, 8 Drawing Sheets

SEMICONDUCTOR APPARATUS AND DATA WRITE CIRCUIT OF SEMICONDUCTOR APPARATUS FOR PREVENTING TRANSMISSION ERROR

CROSS-REFERENCES TO RELATED PATENT APPLICATION

The application is a continuation-in-part of application Ser. No. 12/345,860, filed on Dec. 30, 2008, titled "SEMICONDUCTOR APPARATUS, DATA WRITE CIRCUIT OF SEMICONDUCTOR APPARATUS, AND METHOD OF CONTROLLING DATA WRITE CIRCUIT" which is incorporated here in by reference in its entirety as if set forth in full, and which claims priority under 35 U.S.C 119(a) to Korean Application No. 10-2008-0112687, filed on Nov. 13, 2008, in the Korean Intellectual Property Office, which is incorporated herein by reference in its entirety as set forth in full.

BACKGROUND

The present invention relates generally to a semiconductor apparatus, and more particularly, to a semiconductor apparatus and a data write circuit of a semiconductor apparatus.

Figure 1:
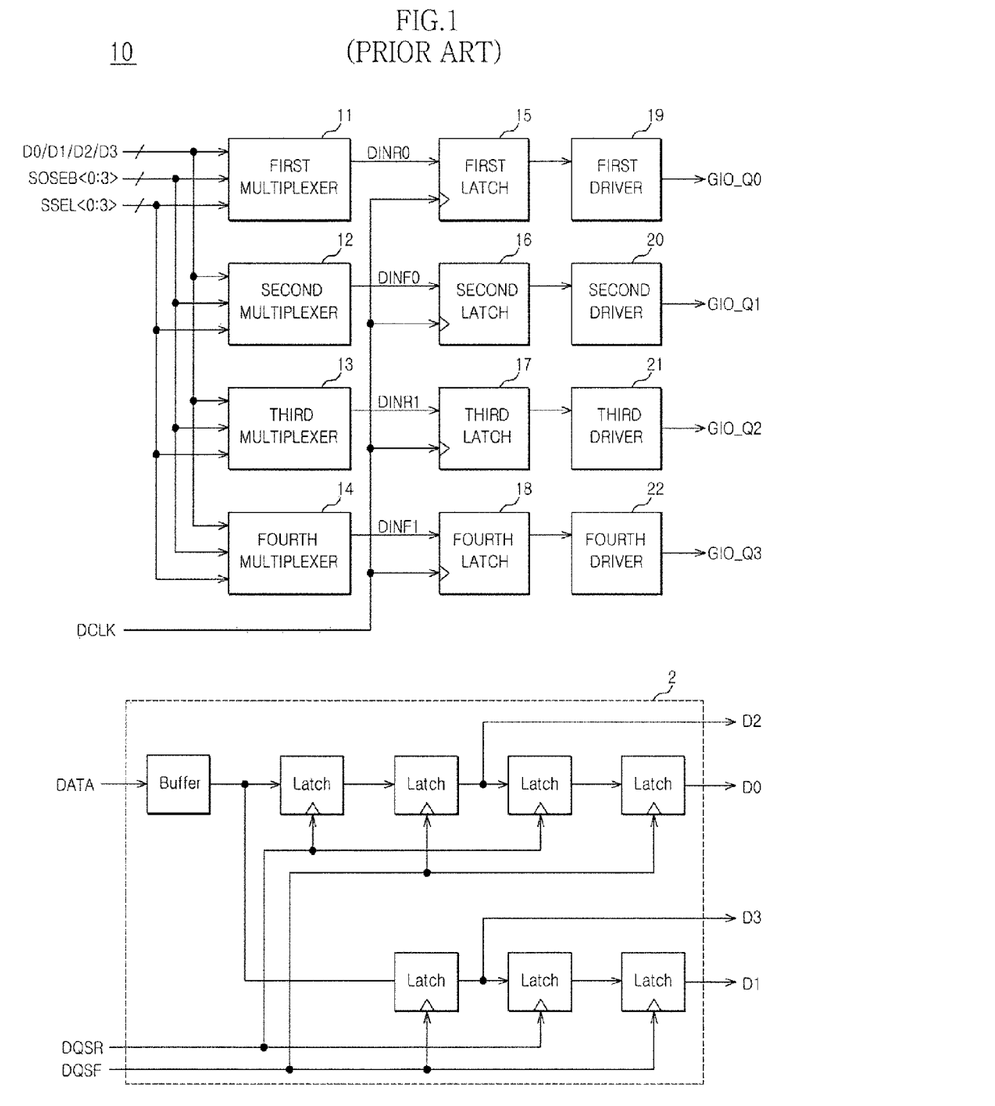
FIG. 1 is a circuit diagram showing a data write circuit of a semiconductor apparatus according to the related art.

FIG. 1 is a circuit diagram showing a data write circuit of a semiconductor apparatus according to the related art.

Referring to FIG. 1, The data write circuit of the semiconductor integrated circuit according to the related art includes pre-patch unit 2, first to fourth multiplexers 11 to 14, first to fourth latches 15 to 18, and first to fourth drivers 19 to 22.

The pre-patch unit 2 can be composed of pipe-latch which comprises buffer and a plurality of latches. The pre-patch unit 2 generates parallel data D0 to D3 by latching data inputted serially.

The pre-patch unit 2 pre-patches the data D0 to D3 in response to signals DQSR and DQSF synchronized with a rising edge and a falling edge of a data strobe signal DQS.

Each of the first to fourth multiplexers 11 to 14 can selectively output data D0 to D3 according to first selection signals SOSEB<0:3> and second selection signals SSEL<0:3>.

The first to fourth latches 15 to 18 latch the output signals 'DINR0', DINF0', 'DINR1', and 'DINF1' of the first to fourth multiplexers 11 to 14, respectively, according to a data clock signal 'DCLK'.

The first to fourth drivers 19 to 22 drive the output signals of the first to fourth latches 15 to 18 and transmit the signals to global input/output lines 'GIO_Q0' to GIO_Q3'.

Figure 2:
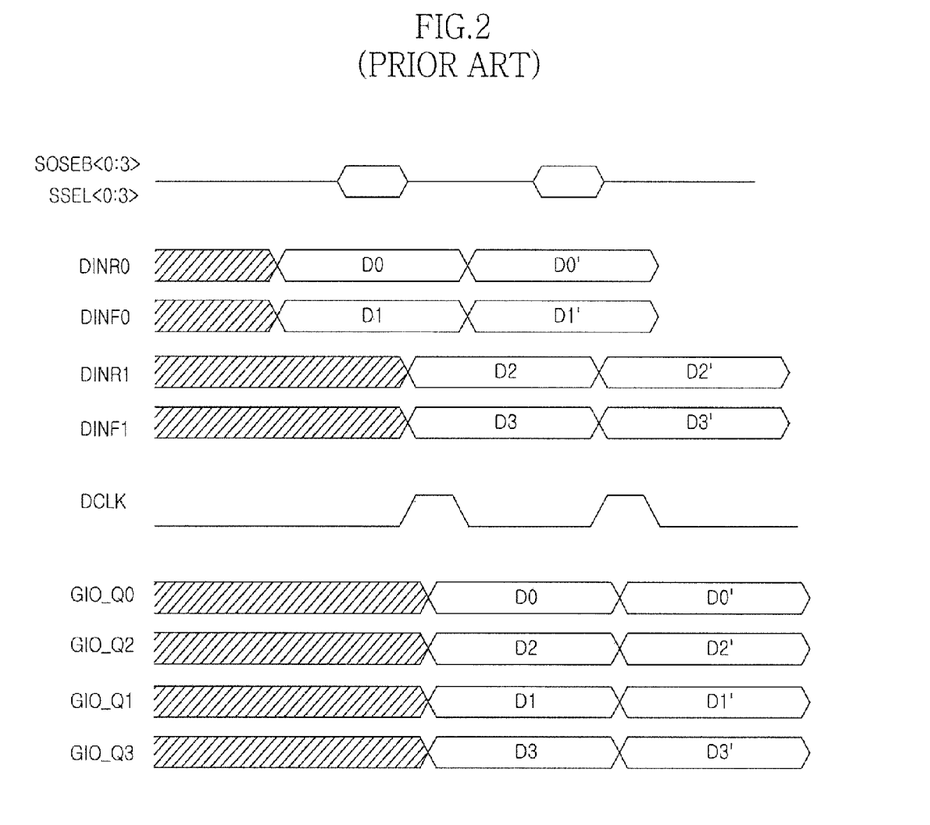
FIG. 2 is a timing chart shown for illustrating the operation of the data write circuit shown in FIG. 1.

FIG. 2 is a timing chart shown for illustrating the operation of the data write circuit shown in FIG. 1.

Referring to FIG. 2, in the data write circuit according to the related art, the signals 'DINR0', 'DINF0', 'DINR1', and 'DINF1' that are output by the first to fourth multiplexers 11 to 14 are simultaneously carried to the global input/output lines 'GIO_Q0' to 'GIO_Q3' in accordance with the data clock signal 'DCLK'.

FIG. 2 shows an example of when four data D0 to D3 are carried to the corresponding global input/output lines 'GIO_Q0' to 'GIO_Q3'. In actuality, a very large number of the global input/output lines will exist. For example, 64 global input/output lines exist in the case of DDR2, and 128 global input/output lines exist in the case of DDR3, and data is simultaneously carried to the very large number of global data lines.

Typically, when the size of a semiconductor apparatus is decreased, the ratio of global data lines to the entire area of the semiconductor apparatus increases and the width of the global data line is narrowed. Consequently, the distance between adjacent global data lines decreases.

When a large amount of data is simultaneously carried to the global input/output lines, the data carried in adjacent global input/output lines will often have different logical levels.

When the data carried in adjacent global input/output lines have opposite logical levels, a data transmission delay is caused by an increase in a parasitic capacitance that is generated by a coupling effect between the data. As a consequence, the transmission characteristics of the semiconductor apparatus are deteriorated and it is possible for errors to be caused during the operation of the semiconductor apparatus.

SUMMARY

Embodiments of the present invention include a semiconductor apparatus and a data write circuit of the semiconductor apparatus that can minimize a coupling effect between data carried in adjacent global input/output lines.

In one aspect, a data write circuit of a semiconductor apparatus includes a pre-patch unit configured to generate a plurality of data by latching data inputted serially; global input/output lines; a plurality of latches configured to be inputted the plurality of data by each, latch and output the plurality of data to the global input/output lines with a determined time difference in response to activation of a plurality of control signals; and a control unit configured to generate the plurality of control signals to be activated at different timings, such that partial data among the plurality of data is outputted at different timing with other data of the plurality of data by partial latches of the plurality of latches.

In another aspect, a data write circuit of a semiconductor apparatus includes a pre-patch unit configured to generate a plurality of data by latching data inputted serially; global input/output lines; a plurality of latches configured to be inputted the plurality of data by each, output partial data among a plurality of data to the global input/output lines at earlier timing than other data of the plurality of data in response to a plurality of control signals; and a control unit configured to determine partial latches that receive the partial data among the plurality of latches, and activate partial control signals of the plurality of control signals input to the partial latches at earlier timing than other control signals of the plurality of control signals.

In another aspect, a semiconductor apparatus includes a pre-patch unit configured to generate a plurality of data by latching data inputted serially; a plurality of latches configured to latch the plurality of data in response to activation of a plurality of control signals; a control unit configured to generate the plurality of control signals to be activated at different timings, such that partial data input at relatively earlier timing among the plurality of data is latched at earlier timing than other data of the plurality of data by partial latches of the plurality of latches; and a plurality of drivers configured to drive the data latched by the plurality of latches and transmit the data to global input/output lines.

A semiconductor apparatus and a data write circuit of the semiconductor apparatus according to an embodiment of the present invention can minimize a coupling effect and prevent lowering of a data transmission speed.

These and other features, aspects, and embodiments are described below in the section "Detailed Description."

BRIEF DESCRIPTION OF THE DRAWINGS

Features, aspects, and embodiments are described in conjunction with the attached drawings, in which.

DETAILED DESCRIPTION

Figure 3:
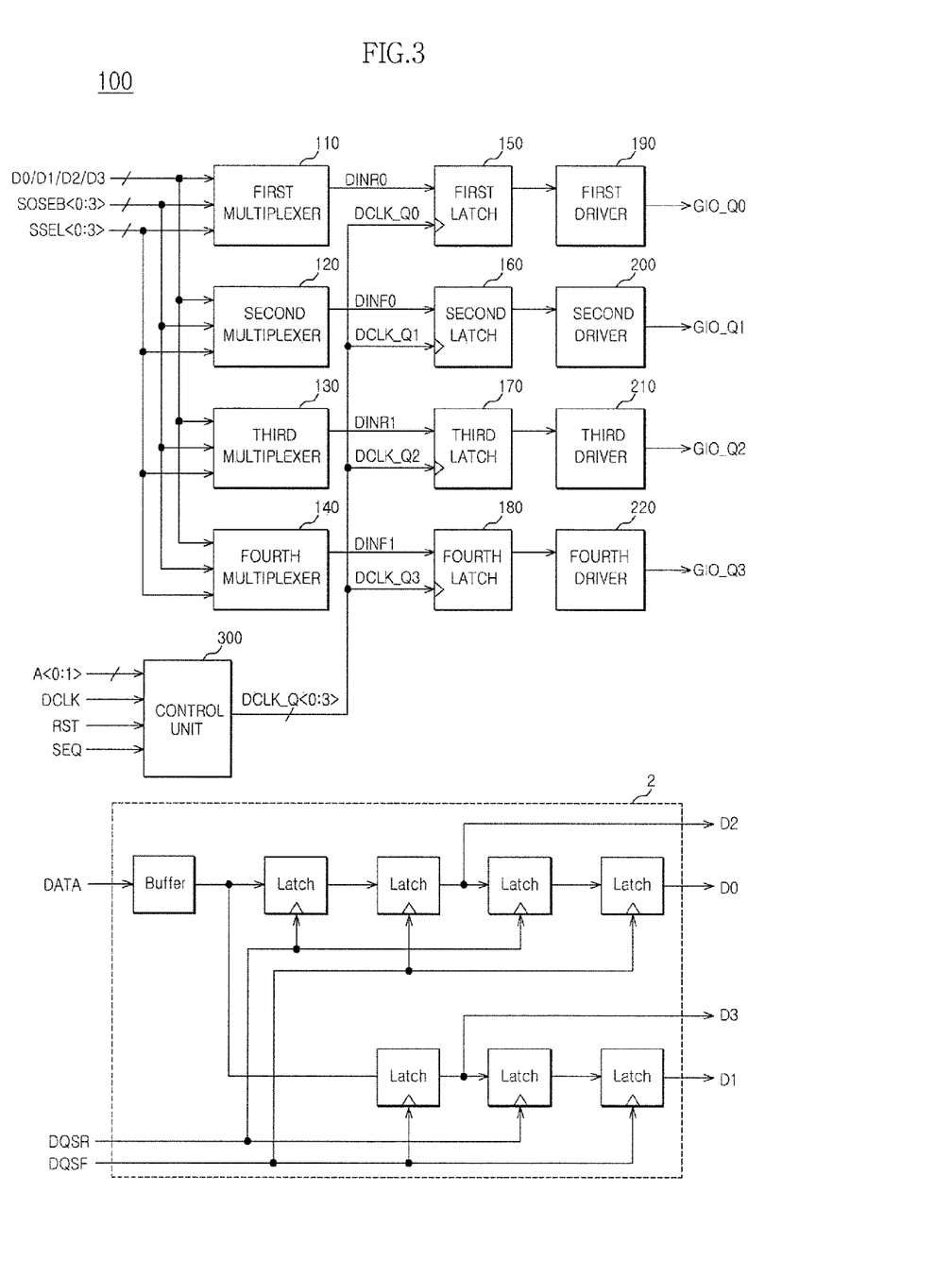
FIG. 3 is a circuit diagram of a data write circuit of an exemplary semiconductor apparatus according to an embodiment of the present invention.

FIG. 3 is a circuit diagram of a data write circuit of an exemplary semiconductor apparatus according to an embodiment of the present invention.

As shown in FIG. 3, the data write circuit of the semiconductor apparatus according to an embodiment of the present invention can include pre-patch unit 2, first to fourth multiplexers 110 to 140, first to fourth latches 150 to 180, first to fourth drivers 190 to 220, and a control unit 300.

The pre-patch unit 2 can be composed of pipe-latch which comprises buffer and a plurality of latches. The pre-patch unit 2 generates parallel data D0 to D3 by latching data inputted serially.

The pre-patch unit 2 pre-patches the data D0 to D3 in response to signals DQSR and DQSF synchronized with a rising edge and a falling edge of a data strobe signal DQS.

Each of the first to fourth multiplexers 110 to 140 can selectively output data D0 to D3 according to first selection signals SOSEB<0:3> and second selection signals SSEL<0:3>.

The first selection signals 'SOSEB<0:3>' can be obtained by decoding lower addresses A0 and A1 among a plurality of addresses that are input according to a write command or a read command, and define the arranged data D0 to D3 and a memory area (for example, a quarter block of a bank) where the arranged data D0 to D3 are written.

The second selection signals 'SSEL<0:3>' can be set in a mode register set and define the arranged data D0 to D3 according to a data transmission method (sequential/interleave method) and a memory area (for example, a quarter block of a bank) where the arranged data D0 to D3 are written.

The first to fourth latches 150 to 180 can latch the output signals 'DINR0', DINF0', 'DINR1', and 'DINF1' of the first to fourth multiplexers 110 to 140 according to a plurality of latch timing control signals 'DCLK_Q0' to 'DCLK_Q3', respectively.

The first to fourth drivers 190 to 220 can drive the output signals of the first to fourth latches 150 to 180 and transmit the signals to global input/output lines 'GIO_Q0' to GIO_Q3'.

The control unit 300 can generate the latch timing control signals 'DCLK_Q0' to 'DCLK_Q3' according to address signals 'A<0:1>', a data clock signal 'DCLK', a reset signal 'RST', and a data transmission mode signal 'SEQ'.

The data transmission mode signal 'SEQ' can be used to define one of a sequential mode and an interleave mode, which are data transmission modes of the semiconductor apparatus. For example, the data transmission mode of the semiconductor apparatus can be defined as the sequential mode or the interleave mode based on whether the data transmission mode signal 'SEQ' is at a high level or a low level.

Figure 4:
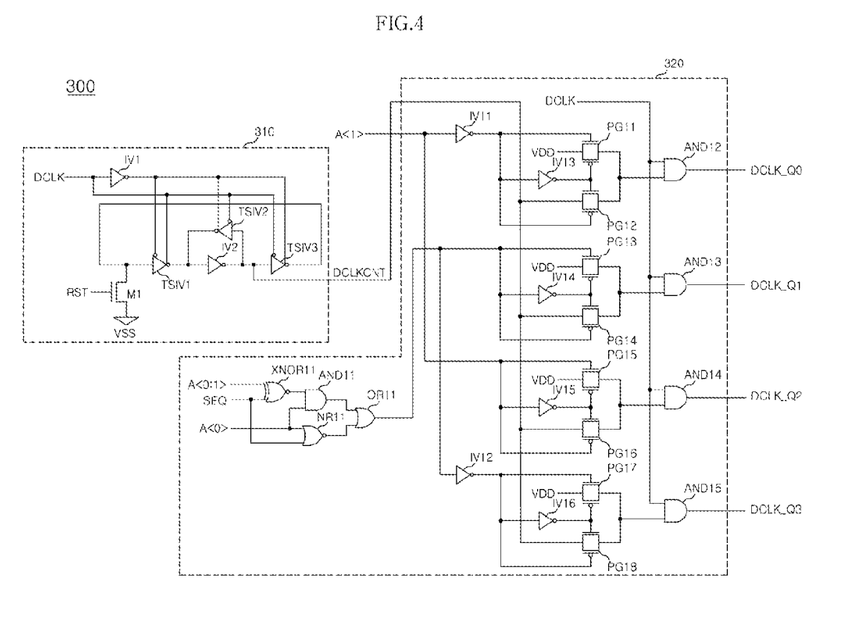
FIG. 4 is a circuit diagram showing the internal structure of the exemplary control unit shown in FIG. 3.

FIG. 4 is a circuit diagram showing the internal structure of an embodiment of the control unit shown in FIG. 3.

Referring to FIG. 4, the control unit 300 can include a divider 310 and a control signal generator 320.

The divider 310 can divide the data clock signal 'DCLK' by a predetermined division ratio to generate a data clock division signal 'DCLKCNT', and initialize the data clock division signal 'DCLKCNT' in response to the reset signal 'RST'.

The divider 310 can generate the data clock division signal 'DCLKCNT' by, for example, dividing the data clock signal 'DCLK' by two. The divider 310 can include a plurality of inverters IV1 and IV2 and a plurality of tri-state inverters TSIV1 to TSIV3.

The control signal generator 320 can generate the latch timing control signals 'DCLK_Q0' to 'DCLK_Q3' in a manner such that the output signals (for example, signals 'DINR0' and 'DINF0') of the multiplexers (among the first to fourth multiplexers 110 to 140) that select data D0 and D1 input at an earlier timing, and the output signals (for example, signals 'DINR1' and 'DINF1') of the multiplexers (among the first to fourth multiplexers) that select the data D2 and D3 input at later timing among the first to fourth multiplexers 110 to 140, are latched by the first to fourth latches 150 to 180 with a predetermined time difference.

In more detail, the control signal generator 320 shown in FIG. 4 can generate the latch timing control signals 'DCLK_Q0' to 'DCLK_Q3' in a manner such that output signals (for example, signals 'DINR0' and 'DINF0') of the multiplexers that select the data D0 and D1 input at earlier timing are latched by the first to fourth latches 150 to 180 before the output signals (for example, signals 'DINR1' and 'DINF1') of the multiplexers that select the data D2 and D3 input at later timing. The respective data D0 to D3 corresponding to the respective output signals 'DINR0', 'DINF0', 'DINR1', and 'DINF1' (which is output from the first to fourth multiplexers 110 to 140) can be changed according to the data transmission mode (sequential mode/interleave mode) and the address signals 'A<0:1>'.

For example, when in sequential mode (SEQ='1'), the output signals 'DINR0', 'DINF0', 'DINR1', and 'DINF1' (which are output from the first to fourth multiplexers 110 to 140) can be D0, D1, D2, and D3 when the address signals 'A<0:1>' are '00'; the output signals 'DINR0', 'DINF0', 'DINR1', and 'DINF1' can be D1, D2, D3, and D0 when the address signals 'A<0:1>' are '01'; the output signals 'DINR0', 'DINF0', 'DINR1', and 'DINF1' can be D2, D3, D0, and D1 when the address signals 'A<0:1>' are '10'; and the output signals 'DINR0', 'DINF0', 'DINR1', and 'DINF1' can be D3, D0, D1, and D2 when the address signals 'A<0:1>' are '11'.

As a further example, when in interleave mode (SEQ='0'), the output signals 'DINR0', 'DINF0', 'DINR1', and 'DINF1' (output from the first to fourth multiplexers 110 to 140) can be D0, D1, D2, and D3 when the address signals 'A<0:1>' are '00'; the output signals 'DINR0', 'DINF0', 'DINR1', and 'DINF1' can be D1, D0, D2, and D3 when the address signals 'A<0:1>' are '01'; the output signals 'DINR0', 'DINF0', 'DINR1', and 'DINF1' can be D2, D3, D0, and D1 when the address signals 'A<0:1>' are '10'; and the output signals 'DINR0', 'DINF0', 'DINR1', and 'DINF1' can be D3, D2, D1, and D0 when the address signals 'A<0:1>' are '11'.

Referring to the example in which the device is in sequential mode (SEQ='1'), and the output signals 'DINR0', 'DINF0', 'DINR1', and 'DINF1' (which are from the first to fourth multiplexers 110 to 140) are D0, D1, D2, and D3 when the address signals 'A<0:1>' are '00'; according to an embodiment of the present invention, the control signal generator 320 can be configured such that the first latch 150 and the second latch 160 latch the input data before the third latch 170 and the fourth latch 180 by activating the latch timing control signals 'DCLK_Q0' and 'DCLK_Q1' at a timing earlier than the activation timing of the latch timing control signals 'DCLK_Q2' and 'DCLK_Q3'.

At this time, the arrangement of the data 'D0 to D3 with respect to the output signals 'DINR0', 'DINF0', 'DINR1', and 'DINF1' (that is, the manner in which the respective data D0 to D3 corresponds to the respective output signals 'DINR0', 'DINF0', 'DINR1', and 'DINF1' of the first to fourth multiplexers 110 to 140) can be recognized through the data transmission mode signal 'SEQ' and the address signals 'A<0:1>', as described above.

Accordingly, the control signal generator 320 can combine the data transmission mode signal 'SEQ', the address signals 'A<0:1>', and the data clock signal 'DCLK' using logical elements to thereby generate the latch timing control signals 'DCLK_Q0' to 'DCLK_Q3' of which activation timings are different from each other according to the arrangement of the data D0 to D3. The control signal generator 320 can be configured to include an XNOR gate XNOR11, a plurality of AND gates AND11 to AND15, a NOR gate NOR11, an OR gate OR11, a plurality of inverters IV11 to IV16, and a plurality of pass gates PG11 to PG18.

The operation of the data write circuit according to an embodiment of the present invention having the above-described structure will now be described.

Figure 5:
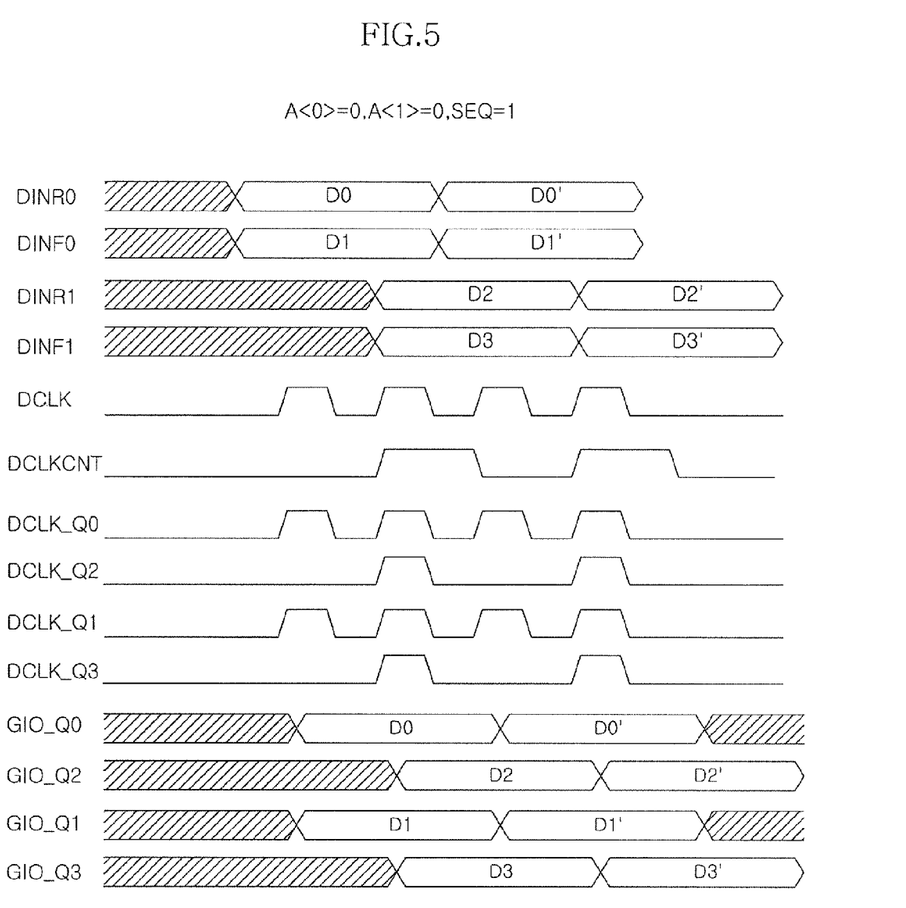
FIGS. 5 to 8 are timing charts shown for illustrating the operation in a sequential mode/interleave mode of the exemplary data write circuit shown in FIG. 3.

FIG. 5 is a timing chart shown for illustrating the operation during sequential mode of the exemplary data write circuit shown in FIG. 3. In this case, the address signals 'A<0>=0' and 'A<1>=0' are input.

This case corresponds to when a corresponding mode is the sequential mode (SEQ=1) and the address signals 'A<0>=0' and 'A<1>=0' are input. Thus, the output signals 'DINR0', 'DINF0', 'DINR1', and 'DINF1' from the first to fourth multiplexers 110 to 140 are D0, D1, D2, and D3.

Since the control signal generator 320 that is shown in FIG. 4 receives the address signals 'A<0>=0' and 'A<1>=0', a high-level signal is output from the OR gate OR11 and the pass gates PG11, PG13, PG16, and PG18 can be turned on.

The AND gates AND12 and AND13 perform an AND logical operation on a power supply voltage VDD passed by respective pass gates PG11 and PG13 and the data clock signal 'DCLK' to generate the latch timing control signals 'DCLK_Q0' and 'DCLK_Q1'.

The AND gates AND14 and AND15 perform an AND logical operation on the data clock division signal 'DCLKCNT' passed by the respective pass gates PG16 and PG18 and the data clock signal 'DCLK' to the generate latch timing control signals 'DCLK_Q2' and 'DCLK_Q3'.

Accordingly, as shown in FIG. 5, the latch timing control signals 'DCLK_Q0' and 'DCLK_Q1' can be activated and output before the latch timing control signals 'DCLK_Q2' and 'DCLK_Q3'.

The first to fourth latches 150 to 180 shown in FIG. 3 can therefore latch the output signals 'DINR0', 'DINF0', 'DINR1', and 'DINF1' from the first to fourth multiplexers 110 to 140 in accordance with the latch timing control signals 'DCLK_Q0' to 'DCLK_Q3' shown in FIG. 5 and can output the latched signals.

The first to fourth drivers 190 to 220 can thus output the output signals from the first to fourth latches 150 to 180 to the global input/output lines 'GIO_Q0' to 'GIO_Q3'.

The data that is transmitted through the global input/output lines 'GIO_Q0' to 'GIO_Q3' can be written to a memory area by a circuit block (not shown) that is related to data write.

Figure 6:
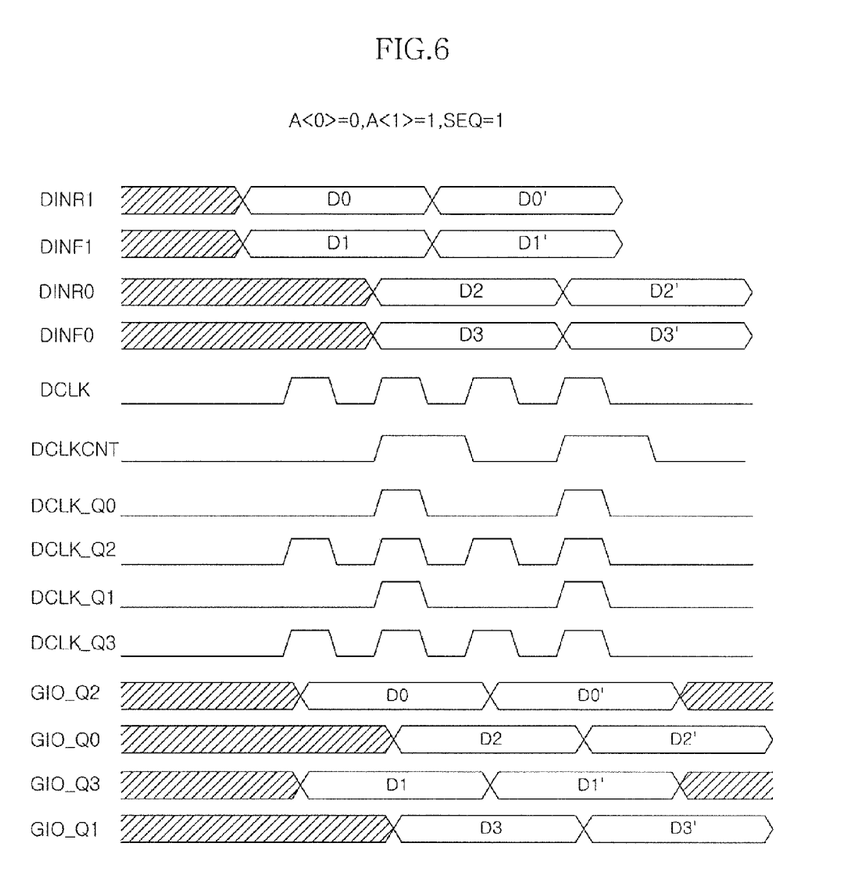

FIG. 6 is a timing chart shown for illustrating the operation during sequential mode of an exemplary data write circuit shown in FIG. 3. In this case, the address signals 'A<0>=0' and 'A<1>=0' are input.

This case corresponds to when a corresponding mode is the sequential mode (SEQ=1) and the address signals 'A<0>=0' and 'A<1>=1' are input. Thus, the output signals 'DINR0', 'DINF0', 'DINR1', and 'DINF1' from the first to fourth multiplexers 110 to 140 are D2, D3, D0, and D1.

Since the control signal generator 320 that is shown in FIG. 4 receives the address signals 'A<0>=0' and 'A<1>=1', a low-level signal is output from the OR gate OR11 and the pass gates PG12, PG14, PG15, and PG17 can be turned on.

The AND gates AND12 and AND13 perform an AND logical operation on the data clock division signal 'DCLKCNT' passed by the respective pass gates PG12 and PG13 and the data clock signal 'DCLK' to generate the latch timing control signals 'DCLK_Q0' and 'DCLK_Q1'.

The AND gates AND14 and AND15 perform an AND logical operation on a power supply voltage VDD passed by the respective pass agates PG15 and PG17 and the data clock signal 'DCLK' to generate the latch timing control signals 'DCLK_Q2' and 'DCLK_Q3'.

Accordingly, as shown in FIG. 6, the latch timing control signals 'DCLK_Q2' and 'DCLK_Q3' can be activated and output before the latch timing control signals 'DCLK_Q0' and 'DCLK_Q1'.

The first to fourth latches 150 to 180 shown in FIG. 3 can therefore latch the output signals 'DINR0', 'DINF0', 'DINR1', and 'DINF1' from the first to fourth multiplexers 110 to 140 in accordance with the latch timing control signals 'DCLK_Q0' to 'DCLK_Q3' shown in FIG. 5 and can output the latched signals.

The first to fourth drivers 190 to 220 can thus output the output signals from the first to fourth latches 150 to 180 to the global input/output lines 'GIO_Q0' to 'GIO_Q3'.

The data that is transmitted through the global input/output lines 'GIO_Q0' to 'GIO_Q3' can be written to the memory area by a circuit block (not shown) that is related to data write.

Figure 7:
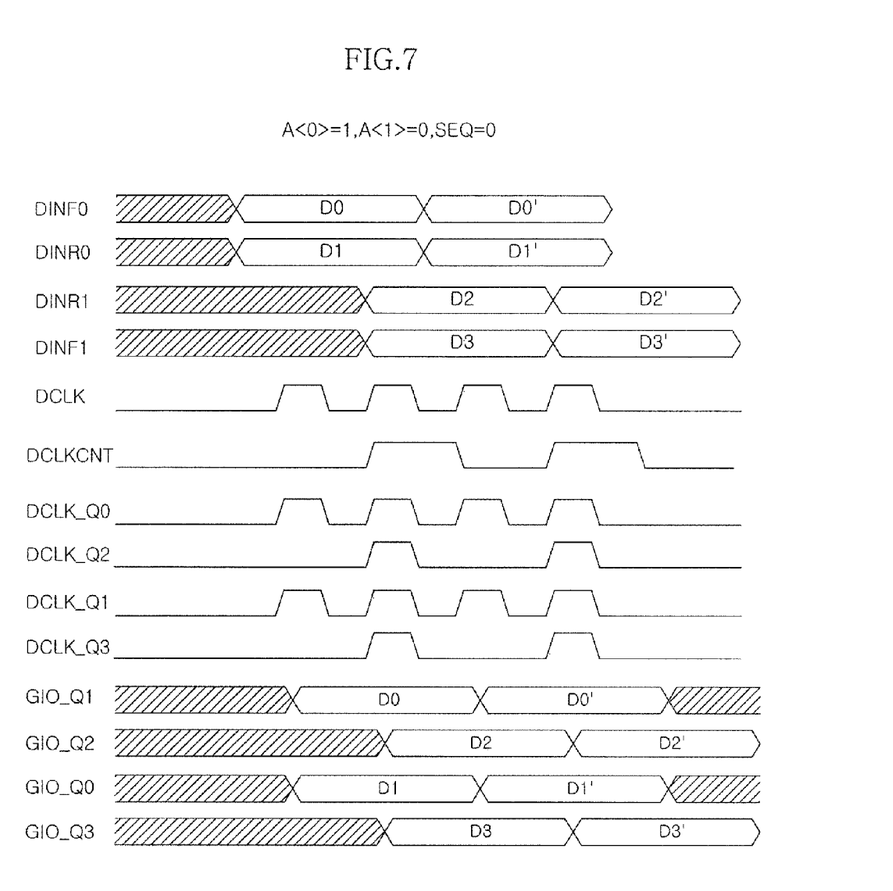

FIG. 7 is a timing chart shown for illustrating the operation during interleave mode of an exemplary data write circuit shown in FIG. 3. In this case, the address signals 'A<0>=1' and 'A<1>=0' are input.

This case corresponds to when a corresponding mode is the interleave mode (SEQ=0) and the address signals 'A<0>=1' and 'A<1>=0' are input. Thus, the output signals 'DINR0', 'DINF0', 'DINR1', and 'DINF1' from the first to fourth multiplexers 110 to 140 are D1, D0, D2, and D3.

Since the control signal generator 320 that is shown in FIG. 4 receives the address signals 'A<0>=1' and 'A<1>=0', a high-level signal is output from the OR gate OR11 and the pass gates PG11, PG13, PG16, and PG18 are turned on.

The AND gates AND12 and AND13 perform an AND logical operation on a power supply voltage VDD passed by the respective pass gates PG11 and PG13 and the data clock signal 'DCLK' to generate the latch timing control signals 'DCLK_Q0' and 'DCLK_Q1'.

The AND gates AND14 and AND15 perform an AND logical operation on the data clock division signal 'DCLKCNT' passed by the respective pass gates PG 16 and PG 18 and the data clock signal 'DCLK' to generate the latch timing control signals 'DCLK_Q2' and 'DCLK_Q3'.

Accordingly, as shown in FIG. 7, the latch timing control signals 'DCLK_Q0' and 'DCLK_Q1' can be activated and output before the latch timing control signals 'DCLK_Q2' and 'DCLK_Q3'.

The first to fourth latches 150 to 180 shown in FIG. 3 can therefore latch the output signals 'DINR0', 'DINF0', 'DINR1', and 'DINF1' from the first to fourth multiplexers 110 to 140 in accordance with the latch timing control signals 'DCLK_Q0' to 'DCLK_Q3' shown in FIG. 7 and can output the latched signals.

The first to fourth drivers 190 to 220 can thus output the output signals from the first to fourth latches 150 to 180 to the global input/output lines 'GIO_Q0' to 'GIO_Q3'.

The data that is transmitted through the global input/output lines 'GIO_Q0' to 'GIO_Q3' can be written to the memory area by a circuit block (not shown) that is related to data write.

Figure 8:
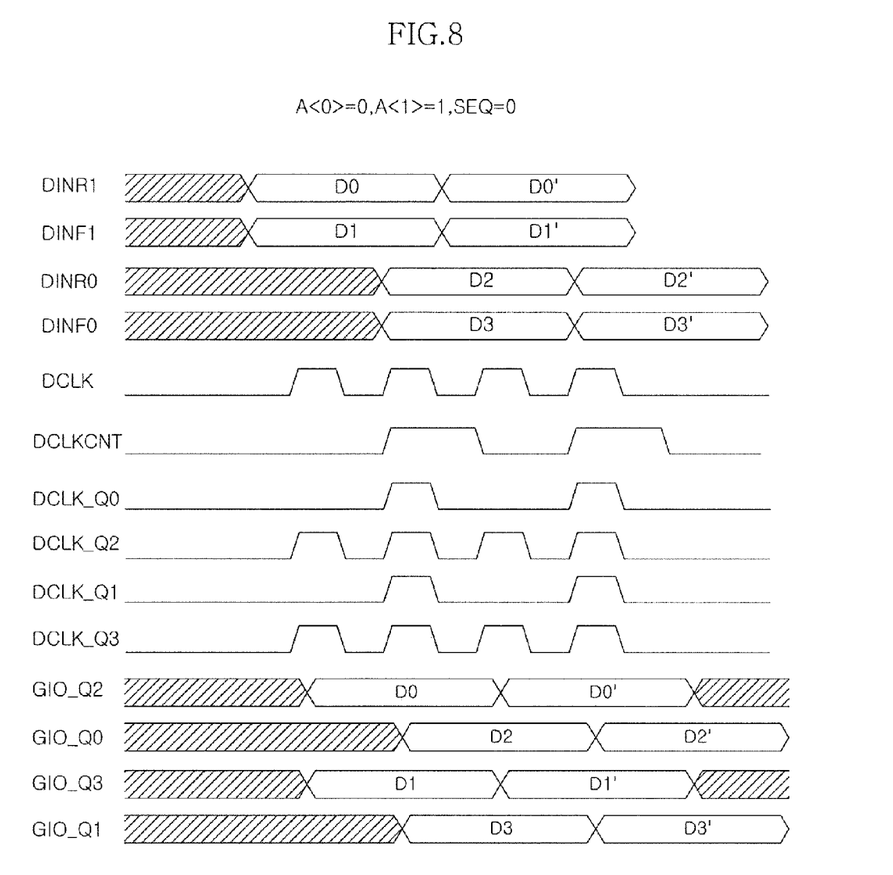

FIG. 8 is a timing chart shown for illustrating the operation during interleave mode of an exemplary data write circuit shown in FIG. 3. In this case, the address signals 'A<0>=0' and 'A<1>=1' are input.

This case corresponds to when a corresponding mode is the interleave mode (SEQ=0) and the address signals 'A<0>=0' and 'A<1>=1' are input. Thus, the output signals 'DINR0', 'DINF0', 'DINR1', and 'DINF1' from the first to fourth multiplexers 110 to 140 are D2, D3, D0, and D1.

Since the control signal generator 320 that is shown in FIG. 4 receives the address signals 'A<0>=0' and 'A<1>=1', a low-level signal is output from the OR gate OR11 and the pass gates PG12, PG14, PG15, and PG17 can be turned on.

The AND gates AND12 and AND13 can perform an AND logical operation on the data clock division signal 'DCLKCNT' passed by the respective pass gates PG12 and PG 14 and the data clock signal 'DCLK' to generate the latch timing control signals 'DCLK_Q0' and 'DCLK_Q1'.

The AND gates AND14 and AND15 perform an AND logical operation on a power supply voltage VDD passed by the respective pass gates PG15 and PG 17 and the data clock signal 'DCLK' to generate the latch timing control signals 'DCLK_Q2' and 'DCLK_Q3'.

Accordingly, as shown in FIG. 8, the latch timing control signals 'DCLK_Q2' and 'DCLK_Q3' can be activated and output before the latch timing control signals 'DCLK_Q0' and 'DCLK_Q1'.

The first to fourth latches 150 to 180 shown in FIG. 3 can therefore latch the output signals 'DINR0', 'DINF0', 'DINR1', and 'DINF1' from the first to fourth multiplexers 110 to 140 in accordance with the latch timing control signals 'DCLK_Q0' to 'DCLK_Q3' shown in FIG. 8 and can output the latched signals.

The first to fourth drivers 190 to 220 can thus output the output signals from the first to fourth latches 150 to 180 to the global input/output lines 'GIO_Q0' to 'GIO_Q3'.

The data that is transmitted through the global input/output lines 'GIO_Q0' to 'GIO_Q3' can be written to the memory area by a circuit block (not shown) that is related to data write.

As described above, in the semiconductor apparatus and data write circuit of the semiconductor apparatus according to embodiments of the present invention, even though the arrangement of data is changed according to whether the sequential mode is used or the interleave mode is used, data input at earlier timing can be latched before data input at later timing and output to the global input/output lines 'GIO_Q0' to 'GIO_Q3'. Accordingly, it is possible to minimize a coupling effect between data carried in adjacent global input/output lines.

While certain embodiments have been described above, it will be understood that the embodiments described are by way of example only. Accordingly, the device and method described herein should not be limited based on the described embodiments. Rather, the devices and methods described herein should only be limited in light of the claims that follow when taken in conjunction with the above description and accompanying drawings.

What is claimed is:

1. A data write circuit of a semiconductor apparatus, comprising:
a pre-patch unit configured to generate a plurality of data by latching data inputted serially;
global input/output lines;
a plurality of latches configured to be inputted the plurality of data, latch and output the plurality of data to the global input/output lines with a determined time difference in response to activation of a plurality of control signals; and
a control unit configured to generate the plurality of control signals to be activated at different timings, such that partial data among the plurality of data is outputted at different timing with other data of the plurality of data by partial latches of the plurality of latches,
wherein the control unit includes:
a divider configured to divide a data clock signal by a predetermined division ratio and generate a data clock division signal; and
a control signal generator configured to generate the plurality of control signals by selecting the data clock signal or a signal acquired by combining the data clock division signal and the data clock signal in accordance with a combination of an address signal and a data transmission mode signal.

2. The data write circuit of claim 1, further comprising:
a plurality of multiplexing unit configured to change arrangement order of the plurality of data in accordance with at least one of an address signal and a mode register set signal, and to input arrangement order changed data to the plurality of latches.

3. The data write circuit of claim 2,
wherein the control unit is configured to determine the partial latches in accordance with at least one of a data transmission mode and the address signal, and generate the plurality of control signals.

4. The data write circuit of claim 3,
wherein the control unit is configured to generate the plurality of control signals using at least one of a data transmission mode signal used to define the data transmission mode and the address signal and a data clock signal.

5. A data write circuit of a semiconductor apparatus, comprising:
a pre-patch unit configured to generate a plurality of data by latching data inputted serially;
global input/output lines;
a plurality of latches configured to be inputted the plurality of data, output partial data among a plurality of data to the global input/output lines at earlier timing than other data of the plurality of data in response to a plurality of control signals; and
a control unit configured to determine partial latches that receive the partial data among the plurality of latches, and activate partial control signals of the plurality of control signals input to the partial latches at earlier timing than other control signals of the plurality of control signals,
wherein the control unit includes
a divider configured to divide a data clock signal by a predetermined division ratio and generate a data clock division signal; and a control signal generator configured to generate the plurality of control signals by selecting the data clock signal or a signal acquired by combining the data clock division signal and the data clock signal in accordance with a combination of an address signal and a data transmission mode signal.

6. The data write circuit of claim 5, further comprising:
a plurality of multiplexing unit configured to change arrangement order of the plurality of data in accordance with at least one of an address signal and a mode register set signal, and input arrangement order changed data to the plurality of latches.

7. The data write circuit of claim 6
wherein the control unit is configured to determine the partial latches that receive the partial data among the plurality of latches in accordance with at least one of a data transmission mode and the address signal.

8. The data write circuit of claim 7,
wherein the control unit is configured to generate the plurality of control signals using at least one of a data transmission mode signal used to define the data transmission mode and the address signal and a data clock signal.

9. A semiconductor apparatus, comprising:
a pre-patch unit configured to generate a plurality of data by latching data inputted serially;
a plurality of latches configured to latch the plurality of data in response to activation of a plurality of control signals;
a control unit configured to generate the plurality of control signals to be activated at different timings, such that partial data input at relatively earlier timing among the plurality of data is latched at earlier timing than other data of the plurality of data by partial latches of the plurality of latches; and
a plurality of drivers configured to drive and transmit the data latched by the plurality of latches to global input/output lines,
wherein the control unit includes:
a divider configured to divide a data clock signal by a predetermined division ratio to generate a data clock division signal; and
a control signal generator configured to generate the plurality of control signals by selecting the data clock signal or a signal acquired by combining the data clock division signal and the data clock signal.

10. The semiconductor apparatus of claim 9,
a multiplexing unit configured to change arrangement order of the plurality of data in accordance with at least one of an address signal and a mode register set signal.

11. The semiconductor apparatus of claim 10,
wherein the control unit is configured to determine the partial latches in accordance with at least one of a data transmission mode and the address signal, and generate the plurality of control signals.

12. The semiconductor apparatus of claim 11,
wherein the control unit is configured to generate the plurality of control signals using at least one of a data transmission mode signal used to define the data transmission mode and the address signal and a data clock signal.

* * * * *